(12) United States Patent
Park et al.

(10) Patent No.: US 6,181,014 B1
(45) Date of Patent: Jan. 30, 2001

(54) INTEGRATED CIRCUIT MEMORY DEVICES HAVING HIGHLY INTEGRATED SOI MEMORY CELLS THEREIN

(75) Inventors: Kyu-Charn Park; Duck-Hyung Lee, both of Kyonggi-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/271,519

(22) Filed: Mar. 18, 1999

(30) Foreign Application Priority Data

Mar. 18, 1998 (KR) .................................................. 98-9247

(51) Int. Cl.[7] .......................... H01L 23/48; H01L 23/52; H01L 27/108; H01L 27/76
(52) U.S. Cl. .......................... 257/776; 257/773; 257/907; 257/908; 257/296
(58) Field of Search .................................... 257/296, 301, 257/305, 303, 311, 773, 776, 907, 908, 210, 211, 309

(56) References Cited

U.S. PATENT DOCUMENTS

| | | | |
|---|---|---|---|
| 4,922,453 | 5/1990 | Hidaka .................................... | 365/63 |
| 5,102,819 | * 4/1992 | Matsushita et al. .................... | 437/57 |
| 5,170,243 | * 12/1992 | Dhong et al. .......................... | 365/208 |
| 5,214,601 | 5/1993 | Hidaka et al. ........................... | 365/63 |
| 5,578,847 | * 11/1996 | Aoki et al. .............................. | 257/296 |
| 5,612,559 | * 3/1997 | Park et al. .............................. | 257/302 |
| 5,822,248 | 10/1998 | Satori et al. ..................... | 365/185.21 |
| 5,852,571 | 12/1998 | Kinney ................................. | 365/145 |

* cited by examiner

Primary Examiner—Matthew Smith
Assistant Examiner—Lex H. Malsawma
(74) Attorney, Agent, or Firm—Myers Bigel Sibley & Sajovec

(57) ABSTRACT

Integrated circuit memory devices having highly integrated SOI memory cells therein include an SOI substrate having a semiconductor active layer therein. A first trench isolation region is also provided. The first trench isolation region extends into and partitions the semiconductor active layer into first and second active regions. These first and second active regions are preferably electrically isolated from each other by the first trench isolation region. First and second access transistors are provided in the first and second active regions, respectively, and a first electrically insulating layer is provided on the SOI substrate. A first bit line is also provided at a first level. The first bit line is electrically connected to a first source/drain region of the first access transistor by a first bit line contact. This first bit line contact extends through the first electrically insulating layer and contacts the first source/drain region of the first access transistor. A second electrically insulating layer is also provided on the first bit line, opposite said first electrically insulating layer and a second bit line is provided on the second electrically insulating layer at a second level above the first level. The second bit line is electrically connected to a first source/drain region of the second access transistor by a second bit line contact which extends through the first and second electrically insulating layers and contacts the first source/drain region of the second access transistor. Higher integration densities can be achieved by dividing the active layer into electrically isolated active regions and then forming bit lines at different levels which are electrically connected to access transistors within these isolated active regions.

12 Claims, 17 Drawing Sheets

INTEGRATED CIRCUIT MEMORY DEVICES HAVING HIGHLY INTEGRATED SOI MEMORY CELLS THEREIN

RELATED APPLICATION

This application is related to Korean Application No. 98-9247, filed Mar. 18, 1998, the disclosure of which is hereby incorporated herein by reference.

FIELD OF THE INVENTION

This invention relates to integrated circuit devices and methods of forming integrated circuit devices, and more particularly to integrated circuit memory devices and methods of forming integrated circuit memory devices.

BACKGROUND OF THE INVENTION

A semiconductor memory device such as a DRAM consists of a memory cell array where a plurality of memory cells are regularly arranged as a two-dimensional array, and a peripheral circuit for controlling the memory cells. Each memory cell is selected by selecting both a column signal line called a word line and a row signal line called a bit line.

Further, the DRAM device has a row decoder and a column decoder, each having a plurality of input and output terminals and a sense amplifier connected to each bit line, for amplifying a signal read from the memory cell. Here, with the high capacity and high integration of DRAM devices, a folded bit line type sense amplifier is used between a pair of bit lines BL and BL to amplify the potential difference between these two bit lines. When using such a sense amplifier, word lines equally intersect a pair of bit lines. The word lines may be arranged on top of the active region and opposite the high level bit line, or arranged on top of the field region and opposite the low level bit line. With this type of layout, the area of a unit cell may become $8F^2$, where F is a design rule.

In the meanwhile, with the higher integration of the DRAM device, reduction in the area of a unit cell has been demanded. However, it becomes more difficult to reduce the design rule of a unit cell due to the limit of photolithography processes and the deterioration of electric characteristics of elements. Hence, attempts have been made to reduce the area of a unit cell with the same design rule by changing the layout of a cell or the sensing method. A representative example of these attempts is an open bit line structure where a reference bit line is fixed to the edge of the cell block without being paired with a signal bit line. This can reduce the area of a unit cell down to $6F^2$, but has a problem of decreasing the sensing margin due to an increase in noise.

Recently, a structure where elements are arranged at both sides of an SOI substrate is being widely used to reduce the area of a unit cell. The SOI technique isolates elements from one another by forming the active elements in each silicon island on an insulating substrate. Thus, the SOI structure can provide higher integration and a reduction of processing steps, as compared to the bulk silicon structure. The active elements formed on the SOI substrate are called SOI elements. An SOI element can achieve high operating speed and low power consumption because of a reduction in parasitic capacitance.

A description of a conventional DRAM device having an SOI structure which can maximize the cell size by burying a capacitor under the silicon layer is disclosed in U.S. Pat. No. 5,102,819. This device will now be described with respect to FIGS. 1–2.

FIG. 1 shows a cell layout in a conventional DRAM device using an SOI structure. In the figure, reference numeral 20 (region shown in dotted line) denotes a unit cell consisting of an access transistor and an information storage capacitor. Reference numeral 10 denotes a storage node of the capacitor, reference numeral 5 denotes a semiconductor layer provided as an active region, reference numeral 8 denotes a storage node contact for connecting the source region of the transistor to the storage node of the capacitor, reference numeral 15 denotes a bit line contact for connecting the drain region of the transistor to the bit line, reference numeral 12 denotes a word line provided as a gate of the transistor and reference numeral "F" denotes a design rule.

FIG. 2 is a cross sectional view, taken along line 2-2' of FIG. 1. Referring to FIG. 2, a conventional DRAM cell has a semiconductor substrate 1, a second polysilicon layer 2 for the plate electrode of the capacitor formed on top of the semiconductor substrate 1, a first insulating layer 3 formed on the surface of the plate electrode 2, a recess 4 formed by etching the first insulating layer 3, and a semiconductor layer 5 formed in the recess 4. The semiconductor substrate 1, the second polysilicon layer 2, the first insulating layer 3 and the semiconductor layer 5 constitute the SOI structure. The semiconductor layer 5 is formed of a separate semiconductor substrate different from the semiconductor substrate 1.

Source/drain regions 7 and 6 of the access transistor are formed in the semiconductor layer 5. The drain region 6 is connected to the bit line 16 via a bit line contact 15 formed at the second insulating layer 14, and the source region 7 is connected to a storage node 10 of the capacitor via a storage node contact 8 formed at the first insulating layer 3. Here, reference numeral 12 denotes a gate oxide film and reference numeral 13 denotes a gate.

Each capacitor is formed at the lower portion of a corresponding access transistor. That is, the storage node 10 composed of the first polysilicon layer is formed at the lower portion of the source region 7 and is connected to the source region 7 via the storage node contact 8. A dielectric layer 11 of the capacitor is formed between the storage node 10 and the second polysilicon layer 2. Thus, the semiconductor substrate 1, the second polysilicon layer 2, the dielectric layer 11 and the storage node 10 constitute the information storage capacitor. The semiconductor substrate 1 and the second polysilicon layer 2 serve as a plate electrode of the capacitor.

In the event that a folded bit lines type sense amplifier structure is applied to such conventional DRAM devices, the word line 12 will equally intersect a pair of bit lines, will be placed on the active region 5 in the high level bit line, and will be placed on the field region 18 in the low level bit line. In addition, the bit line 16 is extended over the second insulating layer 14 in the same direction as the active region 5. Here, since a single layer bit line structure is used, a pair of bit lines of a folded bit line structure are arranged to be adjacent and at an identical height (i.e., height corresponding to the thickness of the second insulating layer 14). Therefore, to properly amplify the potential difference between these two bit lines, a sufficient distance "a" should be maintained between adjacent active regions 5 as shown in FIG. 1, and the area of a unit cell (reference numeral 20 in FIG. 1) of a conventional DRAM device with this structure becomes $8F^2$.

SUMMARY OF THE INVENTION

Accordingly, an object of the present invention is to provide a semiconductor memory device using an SOI structure which can increase integration by reducing the area of a unit cell having a buried capacitor and a double-layer bit line structure.

Another object of the present invention is to provide a method for manufacturing a semiconductor memory device using the SOI structure.

To achieve the above object of the present invention, there is provided a semiconductor memory device using a silicon-on-insulator (SOI) structure and a manufacturing method thereof. The semiconductor memory device has a semiconductor layer formed on top of a semiconductor substrate with interposition of a first insulating layer therebetween and provided as an active region, an element isolation film formed on top of the first insulating layer and diagonally arranged to isolate adjacent active regions which cross each other in a length direction and a transistor which is formed on the semiconductor layer and has a gate and source/drain regions. A capacitor is also provided having a first electrode, which is formed at the lower portion of the transistor (with interposition of a second insulating layer between the substrate and the first electrode) and a second electrode which is formed to face the first electrode (with interposition of a dielectric layer between the first electrode and the second electrode) and is connected to the source region of the transistor via a storage node contact formed at the first insulating layer. A first bit line is also formed on top of the semiconductor layer having the transistor formed thereon and connected to the drain region of corresponding transistor (while skipping every other active region). In addition, a second bit line is provided and connected to the drain region of the active region which is not connected to the first bit line at different heights from the first bit line. It is preferred that the element isolation film be arranged to isolate adjacent active regions (which cross each other by a pitch of the gate in a length direction). It is also preferred that the semiconductor memory device have a folded bit line type sense amplifier structure where adjacent first bit lines and adjacent second bit lines are sensed as a pair of bit lines, respectively.

The semiconductor memory device further comprises a third insulating layer which is formed between the first bit line and the semiconductor layer having the transistor and has a first bit line contact for exposing the drain region of a corresponding transistor while skipping every other active region. A fourth insulating layer is also formed between the first and second bit lines and has a second bit line contact for exposing the drain region of the active region where the first bit line contact is not formed.

A memory device according to another embodiment of the present invention includes an SOI substrate having a semiconductor active layer therein. A first trench isolation region is also provided. The first trench isolation region extends into and partitions the semiconductor active layer into first and second active regions. These first and second active regions are preferably electrically isolated from each other by the first trench isolation region. First and second access transistors are provided in the first and second active regions, respectively, and a first electrically insulating layer is provided on the SOI substrate. A first bit line is also provided. The first bit line is electrically connected to a first source/drain region of the first access transistor by a first bit line contact. This first bit line contact extends through the first electrically insulating layer and contacts the first source/drain region of the first access transistor. A second electrically insulating layer is also provided on the first bit line, opposite said first electrically insulating layer and a second bit line is provided on the second electrically insulating layer. The second bit line is electrically connected to a first source/drain region of the second access transistor by a second bit line contact which extends through the first and second electrically insulating layers and contacts the first source/drain region of the second access transistor. Accordingly, based on this embodiment, higher integration densities can be achieved by dividing the active layer into electrically isolated active regions and then forming bit lines at different levels which are electrically connected to access transistors within these isolated active regions.

To achieve another object of the present invention, there is provided a method for manufacturing a semiconductor memory device. The method includes the steps of forming an element isolation film diagonally on top of a first semiconductor substrate to isolate adjacent active regions to be crossed each other in a length direction. A storage node contact for exposing a predetermined portion of the first semiconductor substrate is also formed by depositing a first insulating layer on top of the resultant structure and etching the first insulating layer. A capacitor is formed by sequentially depositing a storage node of the capacitor, a dielectric layer and a plate electrode on top of the first insulating layer, and forming a second insulating layer on the plate electrode and bonding a second semiconductor substrate on the second insulating layer. The bonded structure is then reversed and the rear side of the first semiconductor substrate is polished. A transistor having a gate, a drain region and a source region connected to the storage node of the capacitor via the storage node contact is then formed on the semiconductor layer. A first bit line connected to the drain region of corresponding transistor with skipping every other active region, is formed on top of the resultant structure. A second bit line connected to the drain region of the active region which is not connected to the first bit line, is then formed on top of the first bit line.

As described above, the present invention can reduce the area of unit memory cell by applying a buried capacitor structure in which the capacitor is formed at the lower portion of the transistor by using a semiconductor substrate of SOI structure, and can secure sufficient distance between adjacent active regions for a pair of bit lines of folded bit line structure by forming double-layer bit lines which are formed at different heights from each other while skipping every other active region. Further, it is possible to achieve an active pitch corresponding to the half of the photolithography pitch using a line type trench element isolation region extending along the bit line.

DESCRIPTION OF PREFERRED EMBODIMENTS

Figure 1:
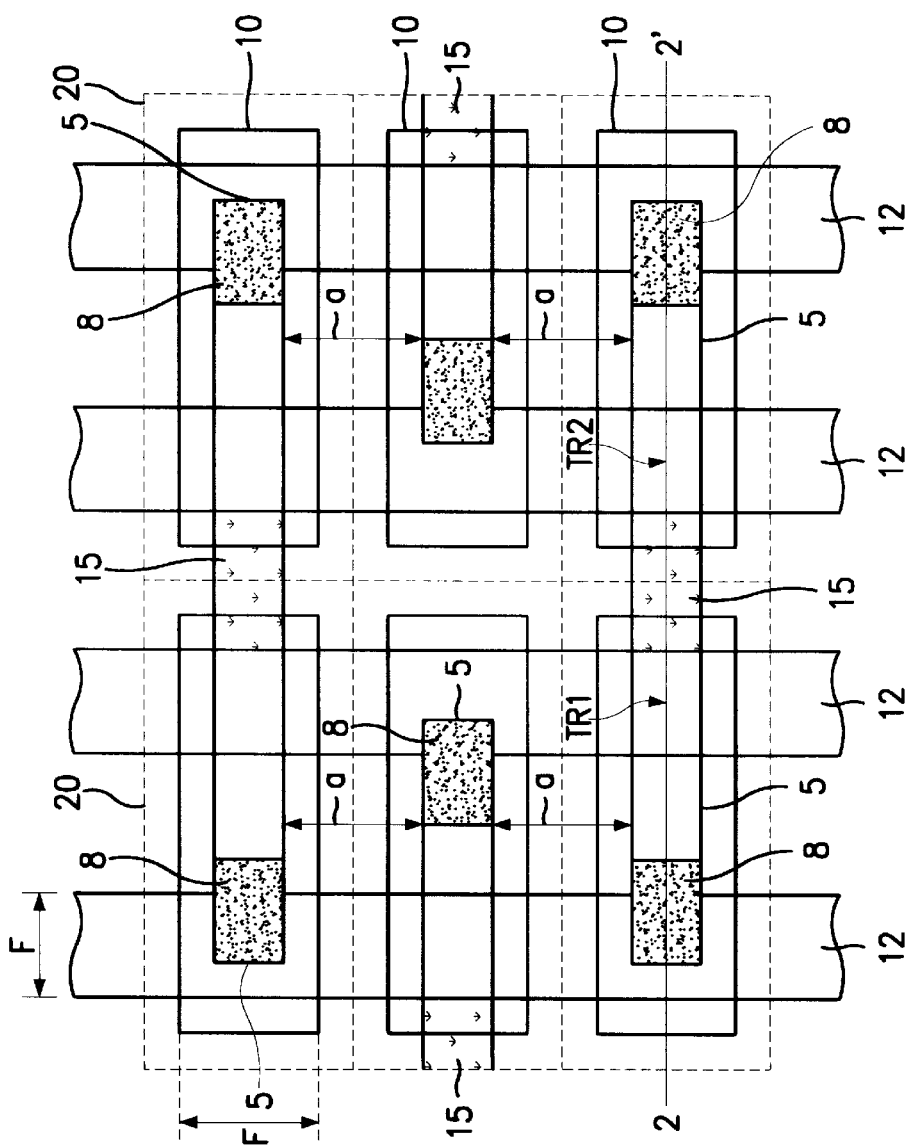
FIG. 1 is a layout view of a prior art memory device.
Figure 2:
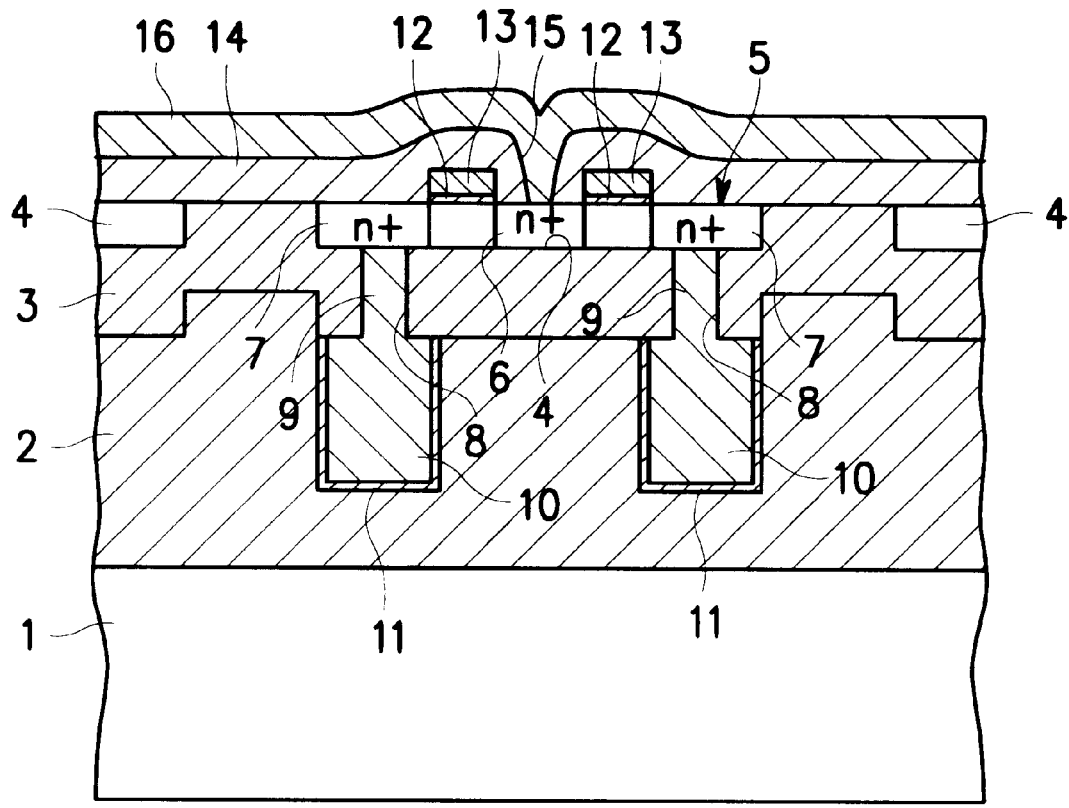
FIG. 2 is a cross-sectional view of the memory device of FIG. 1, taken along line 2-2'.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 3:
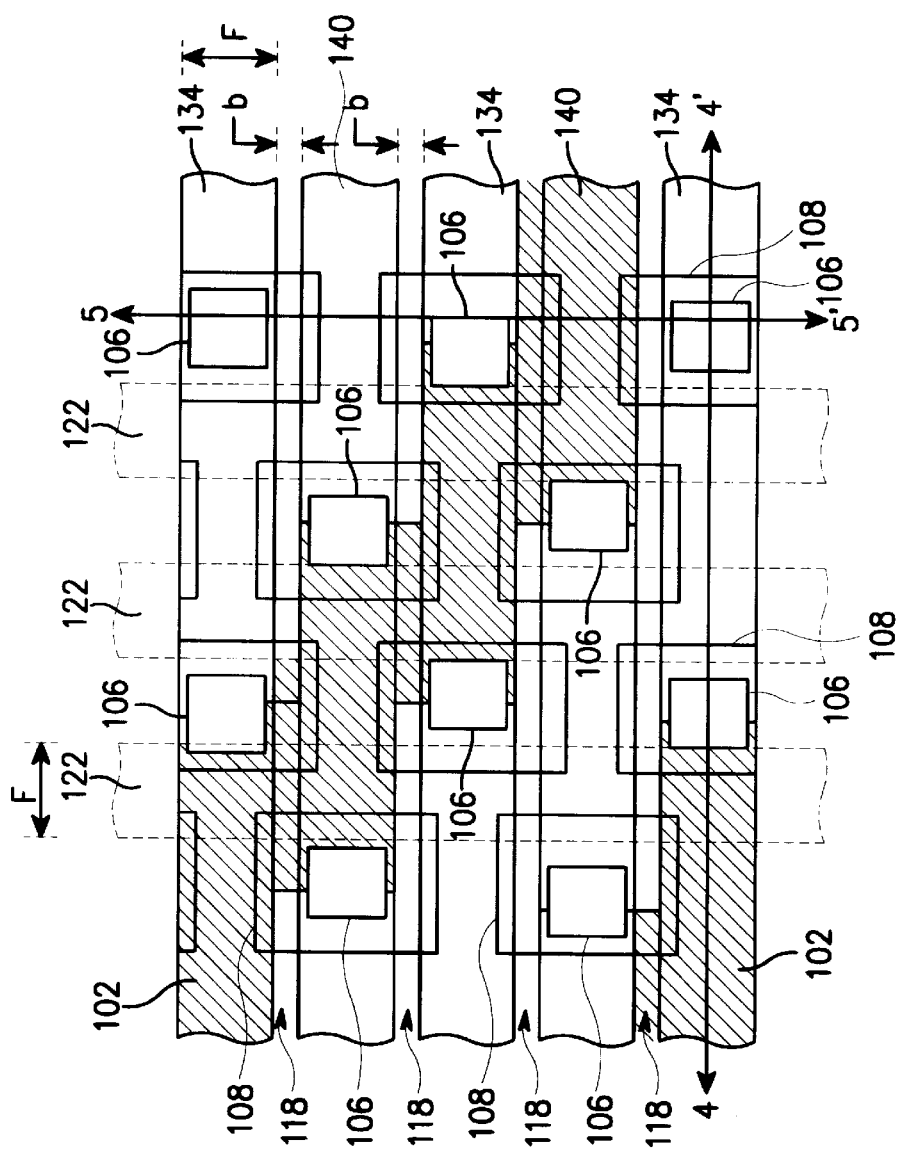
FIG. 3 is a layout view of a memory device according to a first embodiment of the present invention.
Figure 4:
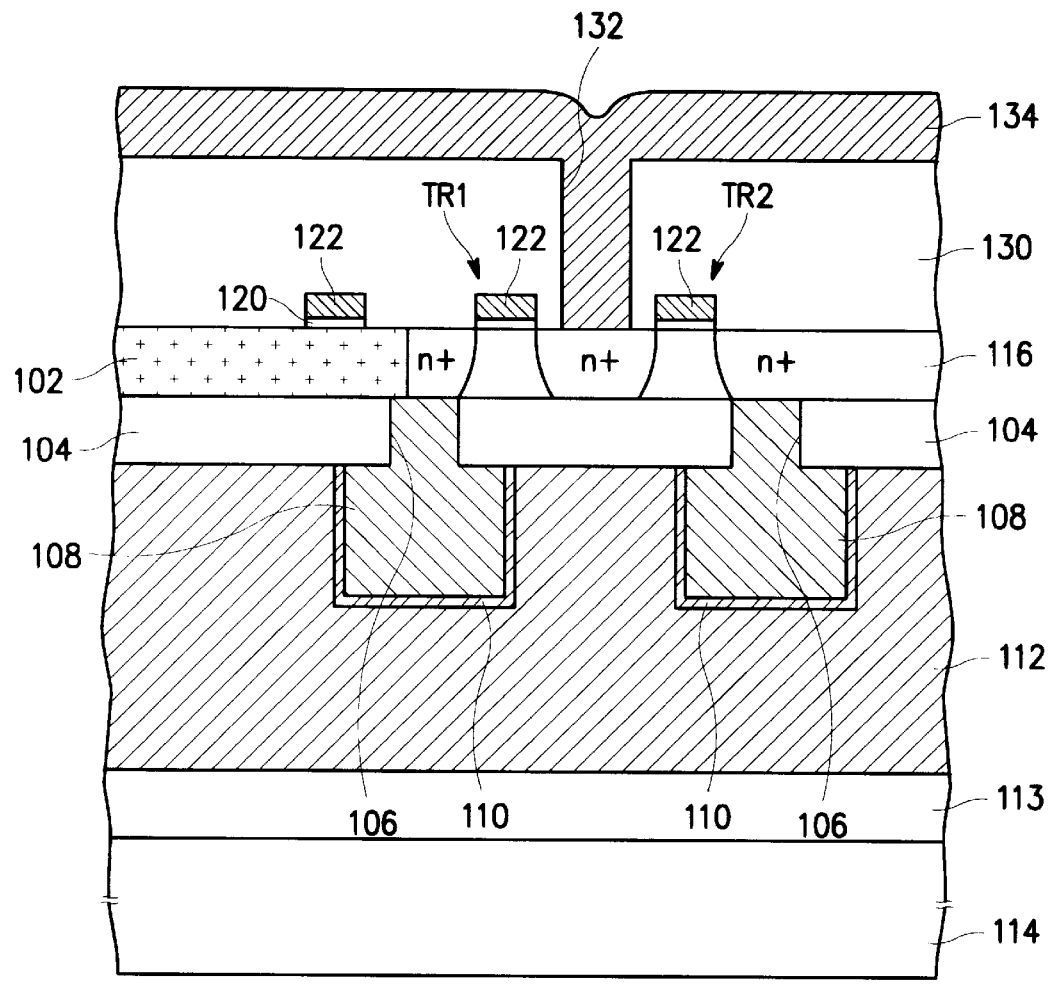
FIG. 4 is a cross-sectional view of the memory device of FIG. 3, taken along line 4-4'.
Figure 5:
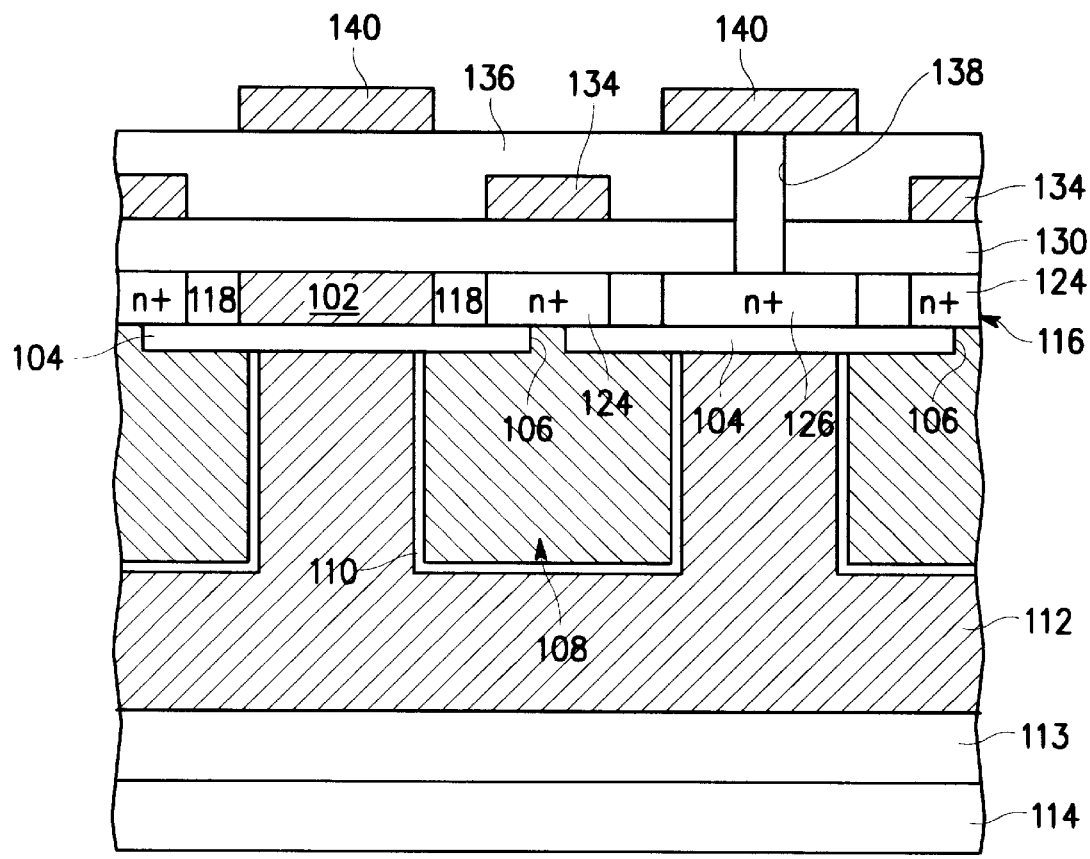
FIG. 5 is a cross-sectional view of the memory device of FIG. 3, taken along line 5-5'.

Referring now to FIG. 3, a layout diagram of a cell in a DRAM device using an SOI structure according to a preferred embodiment of the present invention is illustrated. FIGS. 4 and 5 also represent cross-sectional views of the device of FIG. 3 taken along lines 4-4' and 5-5', respectively. In FIG. 3, reference numeral 102 denotes an element isolation film, reference numeral 106 denotes a storage node contact for connecting a source region of an access transistor to a storage node of a capacitor, reference numeral 108 denotes the storage node of the capacitor, reference numeral 118 denotes a line type trench element isolation region, reference numeral 122 denotes a word line provided as a gate of an access transistor. Reference numeral 132 as shown in FIG. 4 denotes a first bit line contact for connecting a drain region of the transistor to a first bit line. Reference numeral 134 as shown in FIG. 5 denotes the first bit line, reference numeral 138 denotes a second bit line contact for connecting the drain region of the transistor (which is not connected to the first bit line), to a second bit line, and reference numeral 140 denotes the second bit line.

As shown in FIG. 3, the element isolation films 102 for isolating the active regions (which cross one another by the pitch of the gate of the transistor in the length direction) are diagonally arranged. Hence, the storage node contact 106 for connecting the source region of the transistor to the storage node of the capacitor can be formed to properly extend across the element isolation film 102 and the active region, and this makes it possible to secure sufficient distance between the storage node contact 106 and the gate 122.

Further, in the DRAM cell of the present invention, a folded bit line type sense amplifier is structured by using double-layer bit lines which are formed at different heights from each other. That is, after forming the first bit line 134 which is connected to the drain region of an active region of a corresponding transistor (skipping every other active region), an insulating layer (not shown) is deposited on top of the first bit line 134. A second bit line 140 is formed on the insulating layer. The second bit line 140 is connected to the drain region of the active regions where the first bit line 134 is not formed. Thus, the first and second bit line contacts are alternately arranged. Since the DRAM device of the present invention uses a folded bit line type sense amplifier, the two adjacent first bit lines 134 are BL1 and BL1 and the two adjacent second bit lines 140 are BL2 and BL2.

Accordingly, first and second bit lines 134 and 140 extend in the same direction as the active region, but skip every other active region and are at different heights from each other. This makes it possible to secure sufficient distance between adjacent active regions under the same cell area, for a pair of bit lines (BL1 and BL1 or BL2 and BL2). Further, it is possible to achieve an active pitch corresponding to half the photolithography process pitch by isolating the adjacent active regions using a line type trench element isolation region 118 which is extended along the bit line. Using this technique, the distance "b" between adjacent active regions can be remarkably reduced, as compared to a conventional method (see "a" in FIG. 1), and thus the area of a unit cell can be decreased down to $4(1+\sigma)F^2$, where $\sigma$ is defined as a ratio of the difference between the actual active pitch and the design rule(D/R) to the design rule(D/R):

$$\sigma = (W_{active\ region} + W_{element\ isolation\ region} - D/R)/D/R \quad (1)$$

Referring now to FIGS. 4 and 5, the DRAM cell of the present invention has a semiconductor substrate 114, a second insulating layer 113 on the substrate 114, a plate electrode 112 of a capacitor on the second insulating layer 113, a first insulating layer 104 formed on the surface of the plate electrode 112, an element isolation film 102 formed on top of the first insulating layer 104 and a semiconductor layer 116 provided as an active region. The semiconductor substrate 114, the second insulating layer 113, the first insulating layer 104 and the semiconductor layer 116 constitute the SOI structure. The element isolation film 102 isolates the active regions to be crossed each other by the pitch of the gate of the transistor in the length direction, and also serves as a polish stopping layer.

The source/drain regions 124 and 126 of the transistor are formed in the semiconductor layer 116. The drain region 126 formed in one active region is connected to the first bit line 134 via the first bit line contact 132 formed at the third insulating layer 130, while the drain region of another active region is connected to the second bit line 140 via the second bit line contact 138 formed in the third and fourth insulating layers 130 and 136, as illustrated by FIG. 5

Referring still to FIG. 5, the source region 124 is connected to the storage node 108 of the capacitor via the storage node contact 106 formed in the first insulating layer 104. The storage node contact 106 is formed to properly extend across the lower portions of the element isolation film 102 and semiconductor layer 116, thus securing sufficient distance from the gate 122 of the transistor. Each capacitor is formed at the lower portion of corresponding access transistor. That is, the storage node 108 of the capacitor is formed at the lower portion of the source region 124 and is connected to the source region 124 via the storage node contact 106. The dielectric layer 110 of the capacitor is formed on the surface of the storage node 108, and the plate electrode 112 of the capacitor is formed at the lower portions of the dielectric layer 110 and first insulating layer 104, as illustrated.

The third insulating layer 130 having the first bit line contact 132 for exposing the drain region 126 of a corresponding transistor is formed on top of the semiconductor layer 116 where the access transistor is formed, as illustrated by FIG. 4. The first bit line 134 formed on top of the third insulating layer 130 is connected to corresponding drain region 126 via the first bit line contact 132. In addition, the fourth insulating layer 136 (having the second bit line contact 138 for exposing the drain region 126 of the active region where the first bit line contact 132 is not formed) is formed on top of the first bit line 134. The second bit line contact 138 is formed in the fourth and third insulating layers 136 and 130. The second bit line 140 on top of the fourth insulating layer 136 is connected to the corresponding drain region 126 in the second bit line contact 138. Thus, the first and second bit lines 134 and 140 extend in the same direction as the active region, but are at different heights from each other. Further, as shown by FIGS. 3 and 5, the line type trench element isolation region 118 for isolating adjacent active regions 116 is extended along the bit line direction.

Figure 6:
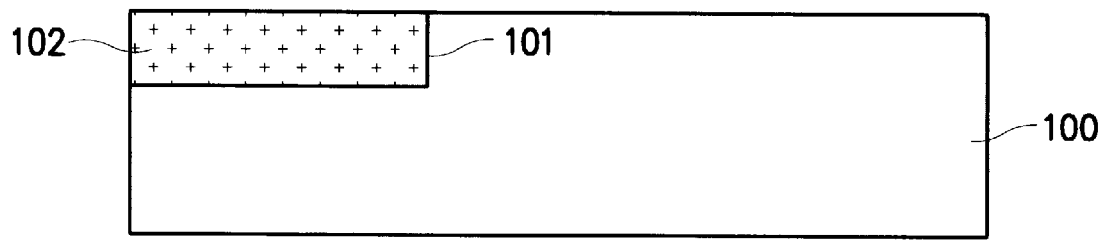
FIGS. 6–10 and 17–18 are cross-sectional views of intermediate structures which illustrate a preferred method of forming the memory device of FIG. 3.

Referring now to FIGS. 6–18, preferred methods of forming DRAM device according to preferred embodiments of the present invention will be described. Like FIG. 4, the cross-sectional views of FIGS. 6–10 and 17–18 are taken along line 4-4' of FIG. 3. FIG. 6 illustrates the step of forming the element isolation film 102. To form thin film 102, a mask layer (not shown) is formed by depositing a CVD (chemical vapor deposition) oxide or a high temperature oxide on top of a P type first semiconductor substrate 100. The mask layer is then patterned using a conventional photolithography technique. Subsequently, the first semiconductor substrate 100 is then etched to a predetermined depth by using the patterned mask layer as an etching mask, to form a trench 101. In this case, the trench 101 is formed so that adjacent active regions (to be crossed each other by the pitch of the gate of the transistor in the length direction) can be isolated from each other.

After removing the mask layer, an insulating material, e.g., an oxide is deposited on the whole surface of the resultant structure and then is etched-back to fill in the trench 101 with the insulating material, thus forming the element isolation film 102. The element isolation films 102 are diagonally arranged as shown in FIG. 3, thus serving to isolate the active regions from each other in the length direction and serving as a polish stopping layer when polishing the rear side of the first semiconductor substrate 100 in a subsequent process.

Figure 7:
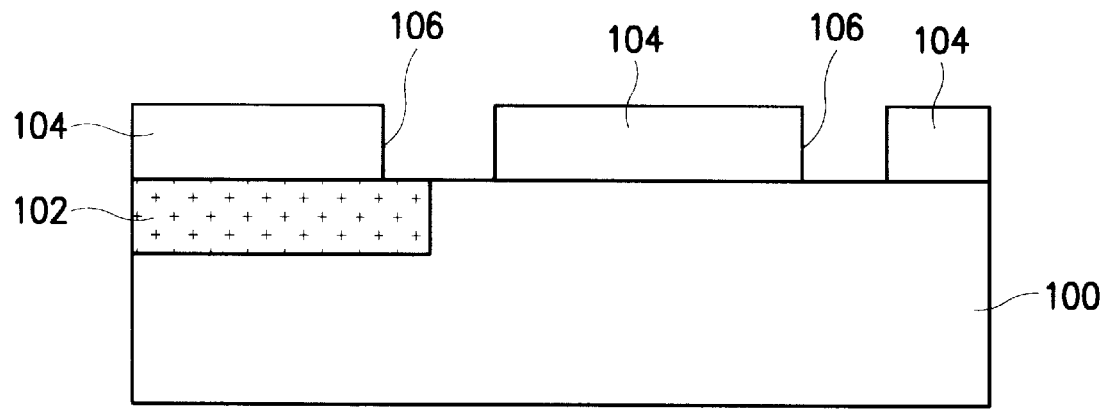

FIG. 7 illustrates the step of forming the first insulating layer 104 and the storage node contact hole 106. After forming the element isolation film 102 as described above, an insulating material (e.g., oxide) is deposited on the whole surface of the resultant structure, to form the first insulating layer 104. Subsequently, the first insulating layer 104 is then etched using a masked photolithography step to form a storage node contact hole 106. In this case, the storage node contact hole 106 is formed to expose portions of the element isolation film 102 and active region. The placement of the contact hole 106 takes into account the diffusion of impurities in the storage node during a subsequent thermal process, so that a sufficient distance from the gate of the subsequently formed transistor can be achieved.

Figure 8:
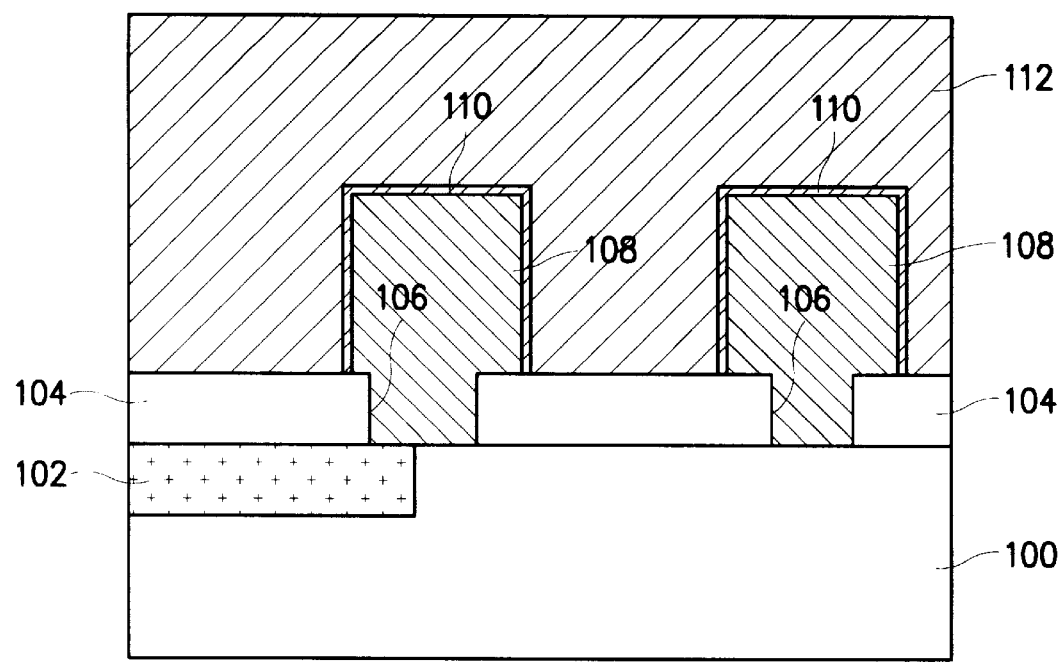

FIG. 8 illustrates the steps of forming the capacitor. After forming the storage node contact hole 106 as described above, a first conductive layer (e.g., a first polysilicon layer doped with impurity) is deposited on the whole surface of the resultant structure. This first conductive layer is then photolithographically patterned to define a plurality of storage nodes 108 which extend into the contact holes 106. Next, an electrically insulating material such as an oxide or ONO (oxide/nitride/oxide) is deposited on the whole surface of the storage node 108, to form the dielectric layer 110 of the capacitor. Next, a second conductive layer (e.g., a second polysilicon layer doped with impurity) is deposited on the dielectric layer 110, to form the plate electrode 112 of the capacitor. As a result, the capacitor for storing information consisting of the storage node 108, the dielectric layer 110 and the plate electrode 112 is completed.

Figure 9:
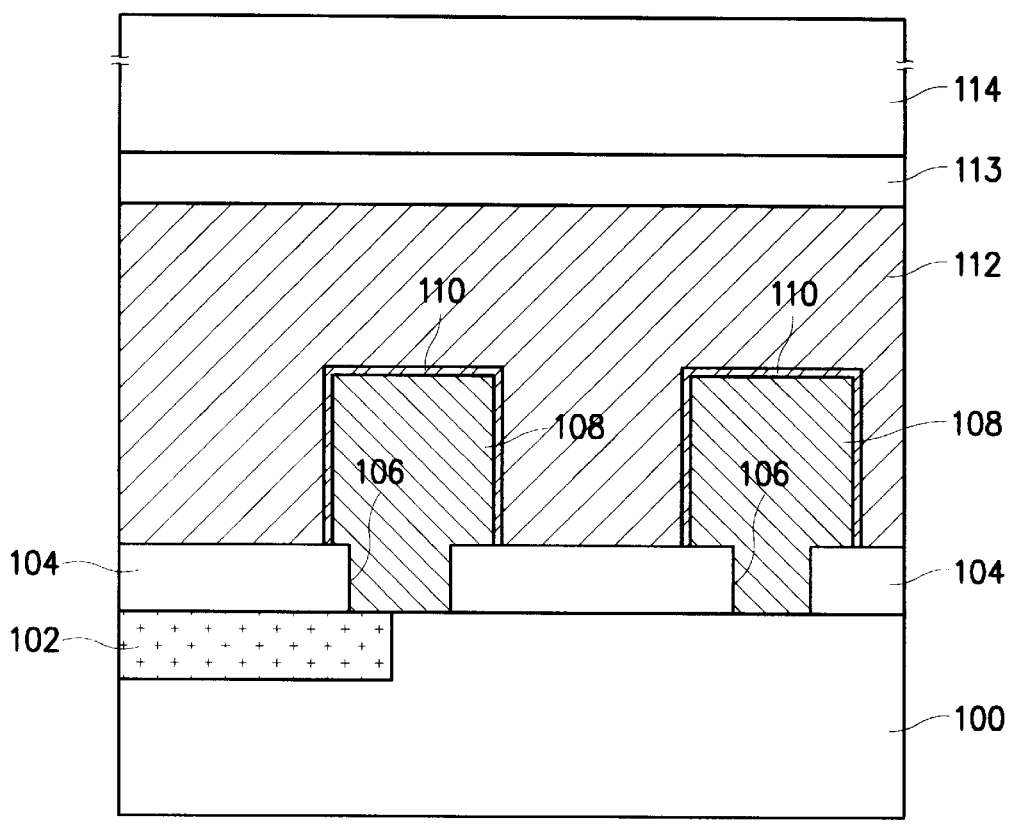
Figure 10:
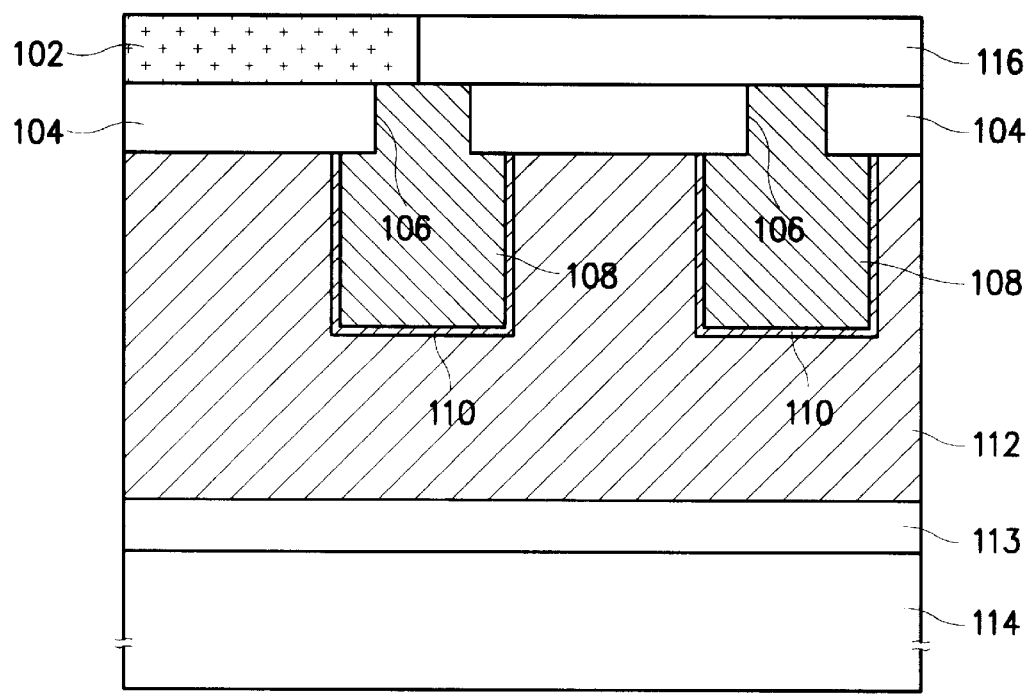

FIG. 9 shows the steps of forming the second insulating layer 113 and the second semiconductor substrate 114. After forming the capacitor as described above, an insulating material (e.g., an oxide) is deposited on top of the plate electrode 112 to form a second insulating layer 113. The surface of the second insulating layer 113 is then planarized using an etch-back or a chemical mechanical polishing (CMP) technique. Next, a new wafer is bonded on top of the planarized second insulating layer 113. This banded wafer acts as a second semiconductor substrate 114. As illustrated by FIG. 10, the second semiconductor substrate 114 serves as a support for all elements formed on the first semiconductor substrate 100.

FIG. 10 shows the step of forming the semiconductor layer 116. After bonding the second semiconductor substrate 114 onto the first semiconductor substrate 100, the resultant structure is reversed. Next, the rear side of the first semiconductor substrate 100 is polished by CMP. This polishing is processed until the surface of the element isolation film 102 is exposed. As a result, the semiconductor layer 116 is formed as an active region. Here, the second semiconductor substrate 114, the second and first insulating layers 113 and 104 and the semiconductor layer 116 constitute an SOI substrate.

Figure 11:
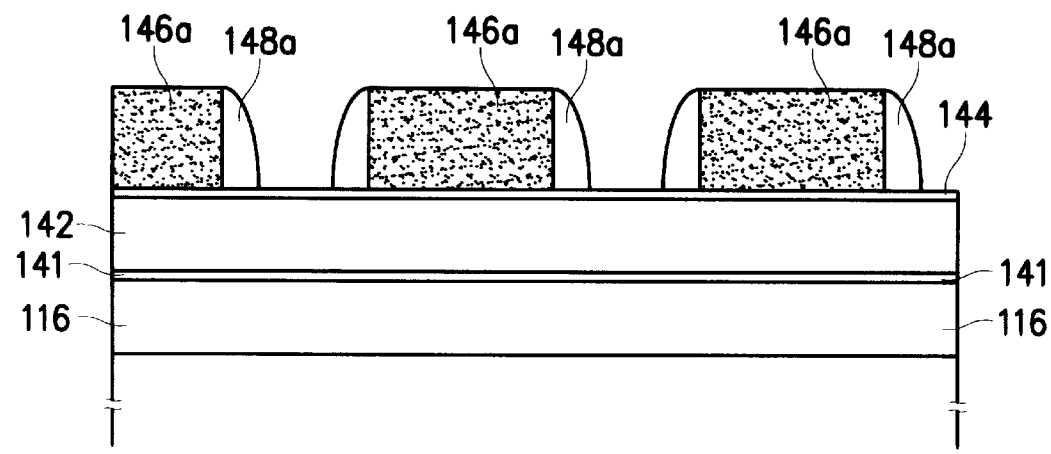
FIGS. 11–16 are cross-sectional views of intermediate structures which illustrate preferred techniques to form electrically isolated active regions within an active layer of an SOI substrate.
Figure 12:
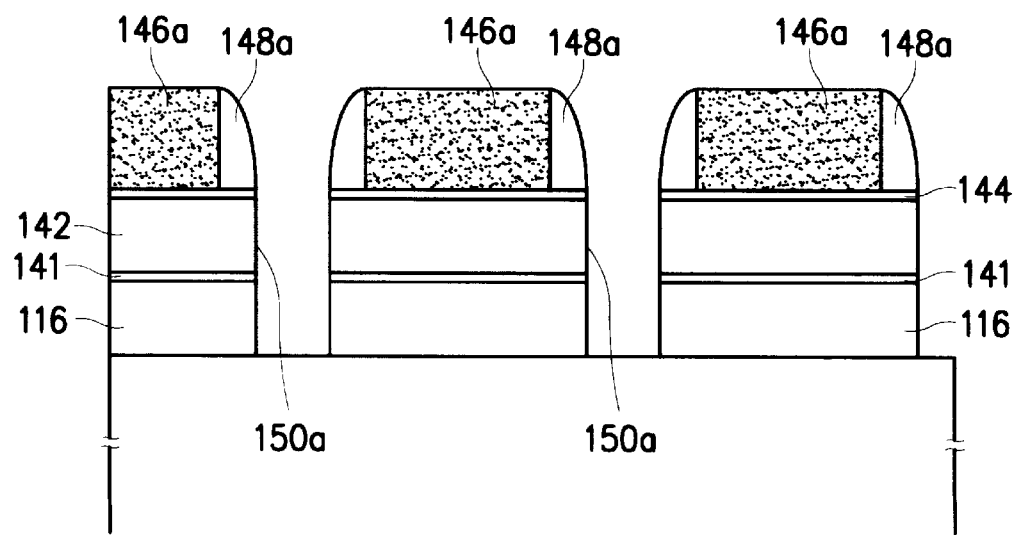
Figure 13:
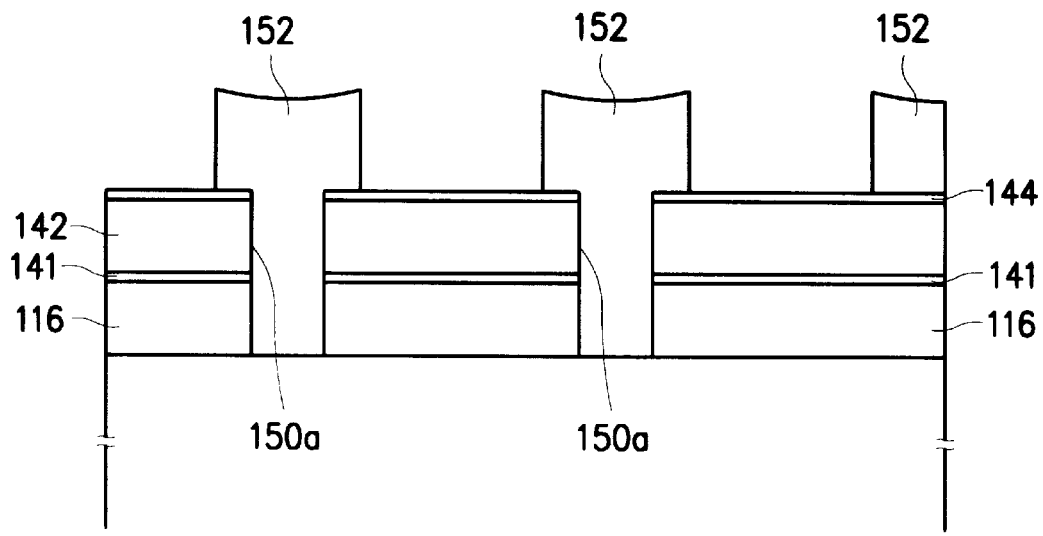

FIGS. 11 to 16 illustrate the steps of forming the line type element isolation regions 118 illustrated by FIG. 3. Referring to FIG. 11, after forming the semiconductor layer 116 as described above, a first oxide film 141, a polysilicon layer 142, a second oxide film 144 and a nitride film 146a are sequentially deposited on top of the semiconductor layer 116. After patterning the nitride film 146a, a third oxide film is deposited on the whole surface of the resultant structure and then is etched-back, for form first spacers 148a at the side walls of the patterned nitride film 146a. Referring to FIG. 12, the second oxide film 144, the polysilicon layer 142, the first oxide film 141 and the semiconductor layer 116 are then sequentially etched using the first spacer 148a as an etching mask, for form first trenches 150a. Referring to FIG. 13, a fourth oxide film is deposited on the whole surface of the resultant structure to a predetermined depth such that the first trenches 150a can be sufficiently filled. The first spacers 148a and the fourth oxide film are then etched back, to form the first oxide film patterns 152 in the first trenches 150a. Next, the nitride film 146a is removed by a wet etching step using phosphoric acid ($H_3PO_4$) solution.

Figure 14:
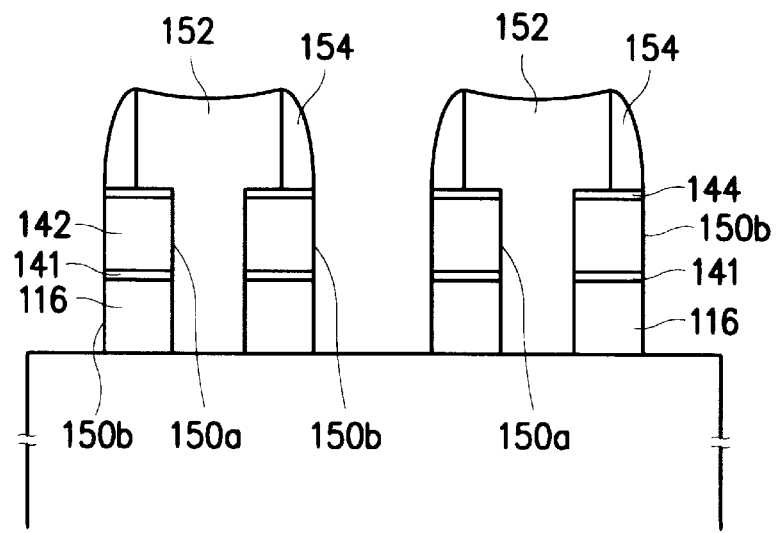
Figure 15:
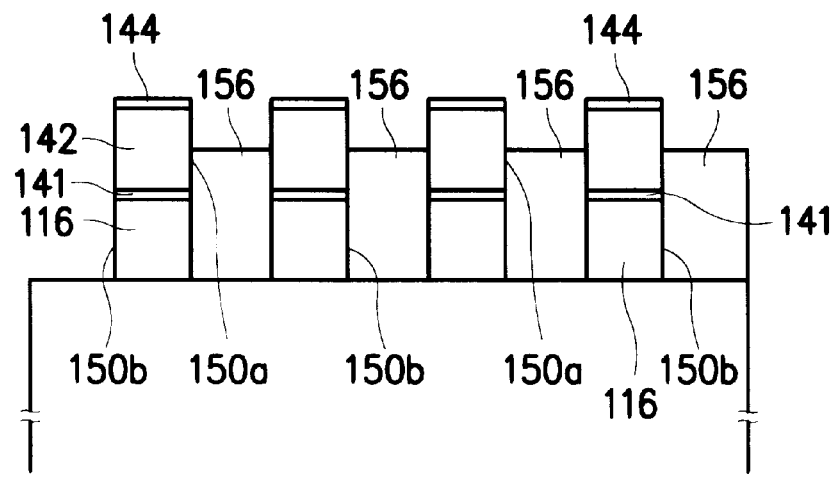

Referring to FIG. 14, a fifth oxide film is deposited on the whole surface of the resultant structure having the first oxide film pattern 152 formed therein. The fifth oxide film is then etched-back, to form a second spacer 154 at the side walls of the first oxide film patterns 152. Next, the second oxide film 144, the polysilicon layer 142, the first oxide film 141 and the semiconductor layer 116 are sequentially etched using the second spacer 154 as an etching mask, to form a second trench 150b. Referring to FIG. 15, a sixth oxide film is deposited on the whole surface of the resultant structure to a predetermined depth such that the second trench 150b can be sufficiently filled and then the first oxide film pattern 152 and the sixth oxide film are etched-back, to form a second oxide film pattern 156 for filling the first and second trenches 150a and 150b.

Figure 16:
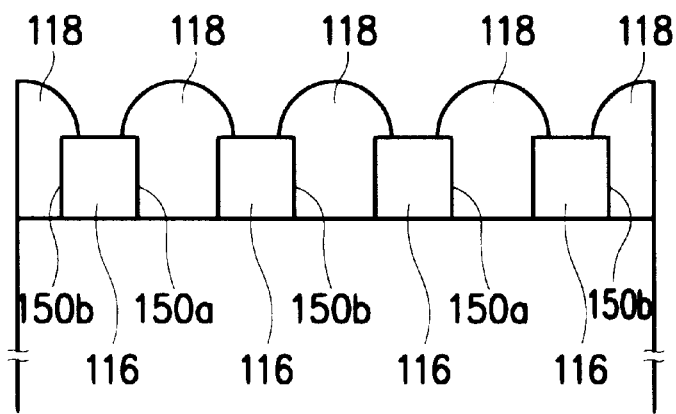

Referring to FIG. 16, after forming the second oxide film patterns 156 as described above, the polysilicon layer 142 is etched-back. Next, a seventh oxide film is deposited on the whole surface of the resultant structure and then is etched-back, thus forming a third spacer consisting of the seventh oxide film at the side walls of the second oxide film pattern 156. As a result, the line type trench element isolation regions 118 for isolating adjacent active regions is formed. The line type trench element isolation regions 118 extend in the bit line direction as shown in FIG. 3. In the above described method for forming the line type trench element isolation regions 118, the width ratio of the active region to the element isolation region can be maximized by controlling the width of the spacers.

Figure 17:
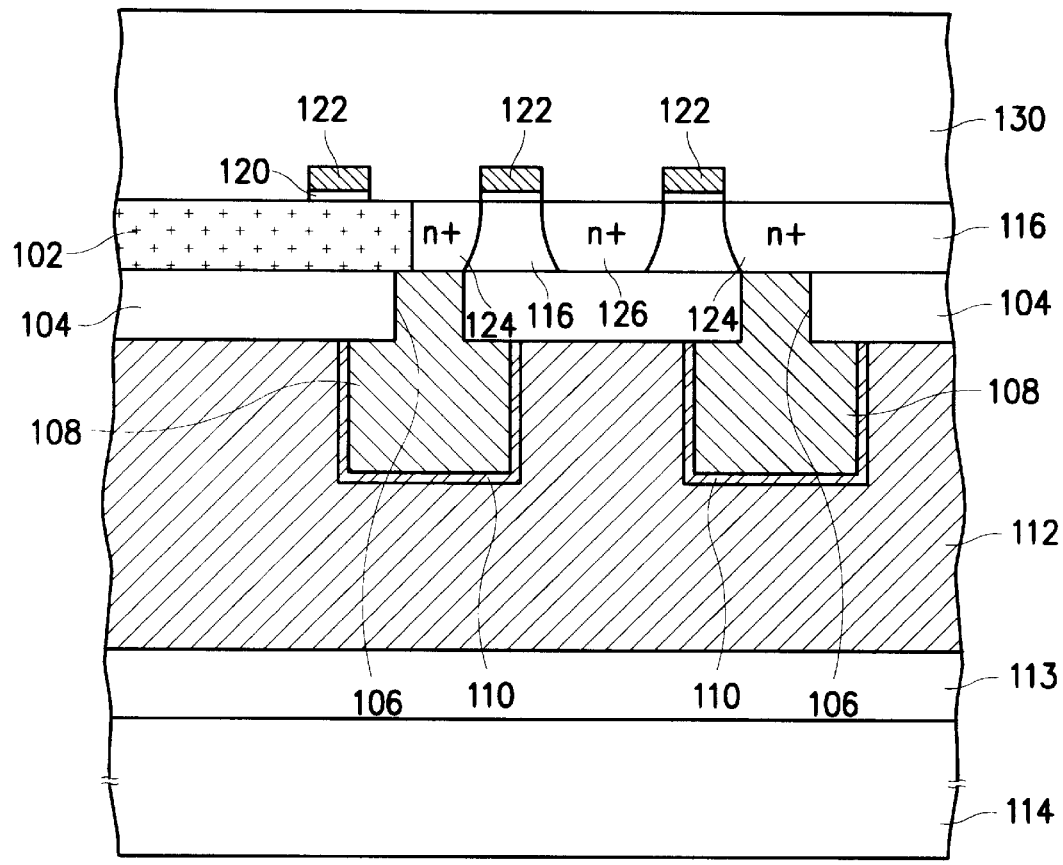

FIG. 17 illustrates the step of forming access transistors in the semiconductor layer 116. After forming the line type trench element isolation regions 118 in the semiconductor layer 116 as described above, a gate oxide film 120 is formed on the surface of the semiconductor layer 116 using thermal oxidation techniques. Subsequently, a conductive layer (e.g., a polysilicon layer doped with impurity or a composite of a polysilicon layer doped with impurity and a metal silicide layer) is deposited on the whole surface of the resultant structure having the gate oxide film 120 formed thereon. This conductive layer is then patterned by photolithography, for form a plurality of gate electrodes 122. Next, an n+ type impurity is ion-implanted by using the gate 122 as an ion-implantation mask, to form n+ source and drain regions 124 and 126 on the surface of the semiconductor layer 116 at both sides of the gate 122. As a result, the access transistor is formed on the semiconductor layer 116. Thereafter, the third insulating layer 130 is formed on the whole surface of the semiconductor layer 116 where the transistor is formed.

Figure 18:
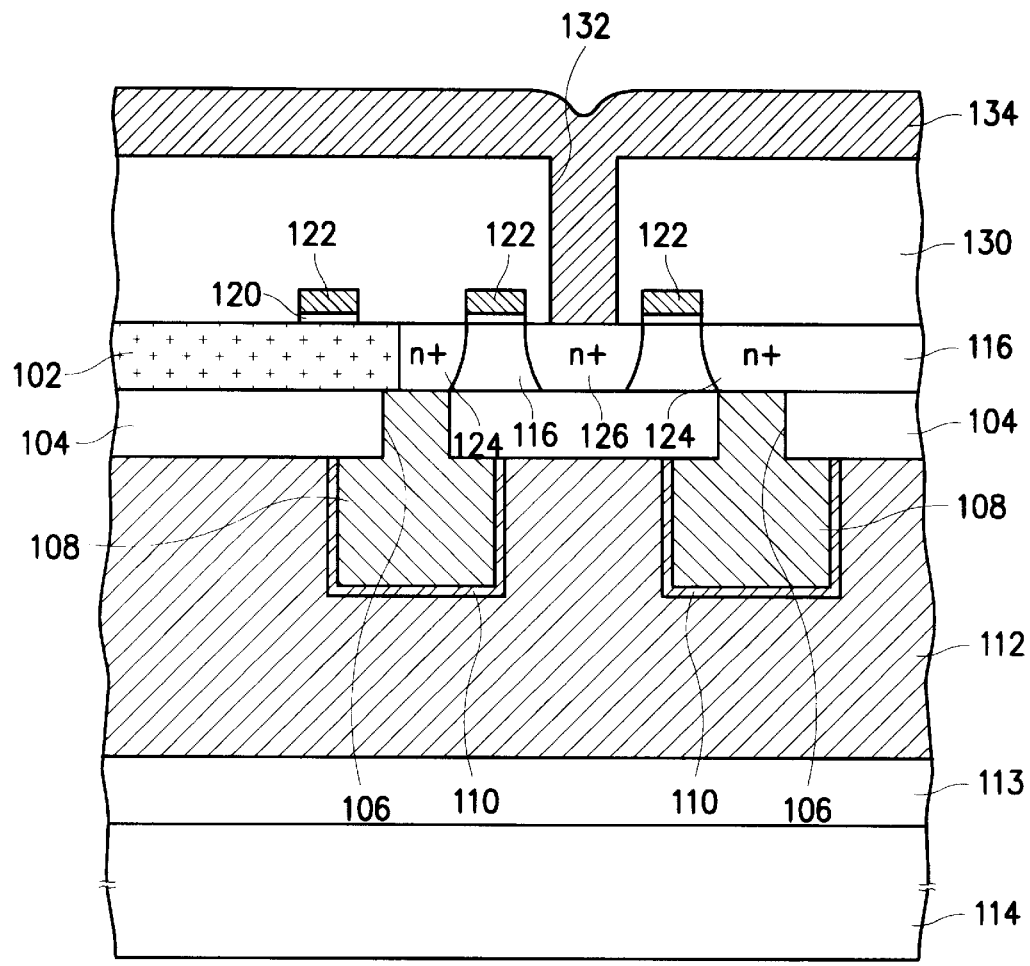

FIG. 18 illustrates the step of forming the first bit line 134. After forming the third insulating layer 130 as described above, the third insulating layer 130 is etched to expose the drain region 126 of a corresponding access transistor (skipping every other active region) and form the first bit line contact 132. Next, a conductive layer is deposited on top of the resultant structure having the first bit line contact 132 formed therein and then is patterned to form the first bit line 134 connected to the drain region 126 of the transistor via the first bit line contact 132. Hence, the first bit line 134 is connected to the drain region 126 of a corresponding access transistor.

Referring again to FIG. 5, the fourth insulating layer 136 is formed on the whole surface of the resultant where the first bit line 134 is formed and then is etched to expose the drain region 126 of the active region where the first bit line contact 132 is not formed, thus forming the second bit line contact 138. Next, a conductive layer is deposited on the top of the resultant structure where the second bit line contact 138 is formed and is patterned to define the second bit line 140 connected to the drain region 126 of the transistor via the second bit line contact 138. Hence, the second bit line 140 is connected to the drain region 126 of every other transistor. Thereafter, though not shown, the fifth insulating layer is formed on the whole surface of the resultant structure where the second bit line 140 is formed, and then a metal wiring layer is formed thereon, to complete the DRAM cell.

Figure 19:
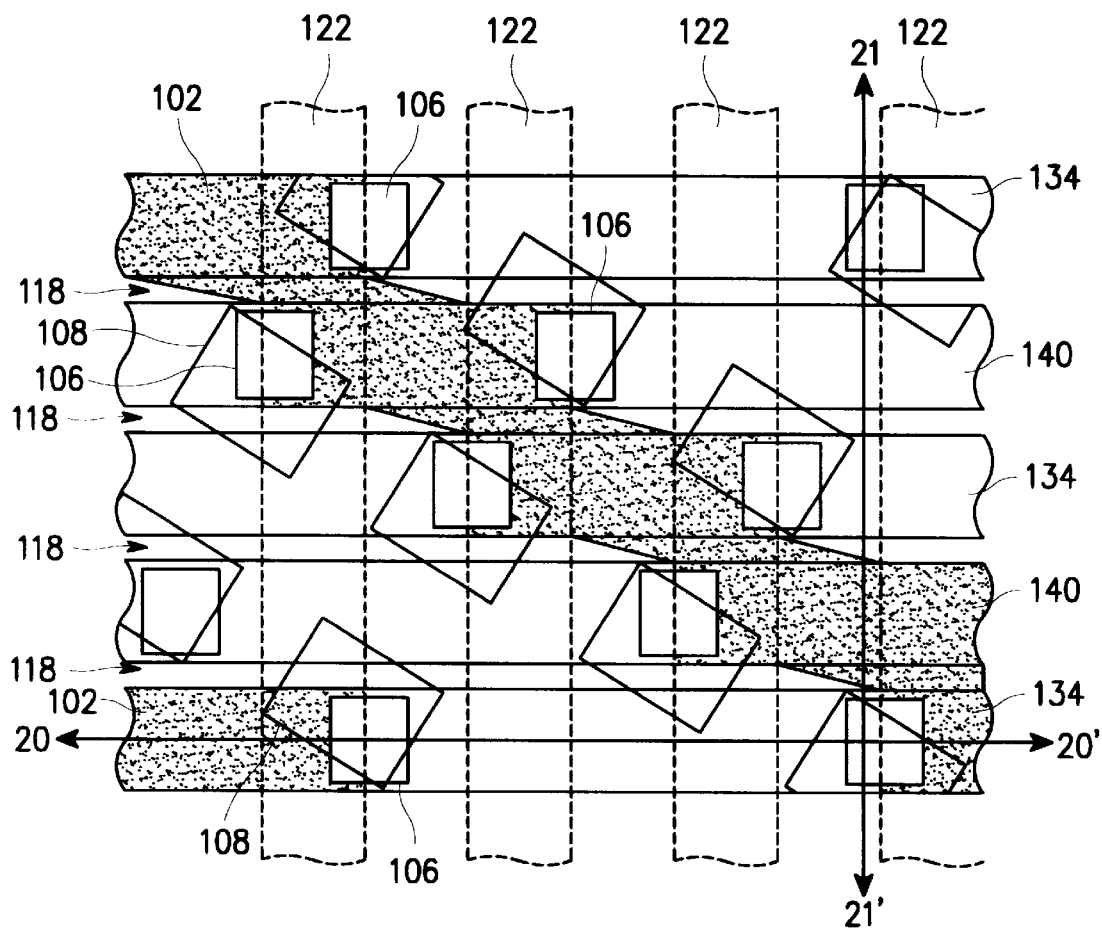
FIG. 19 is a layout view of a memory device according to a second embodiment of the present invention.
Figure 20:
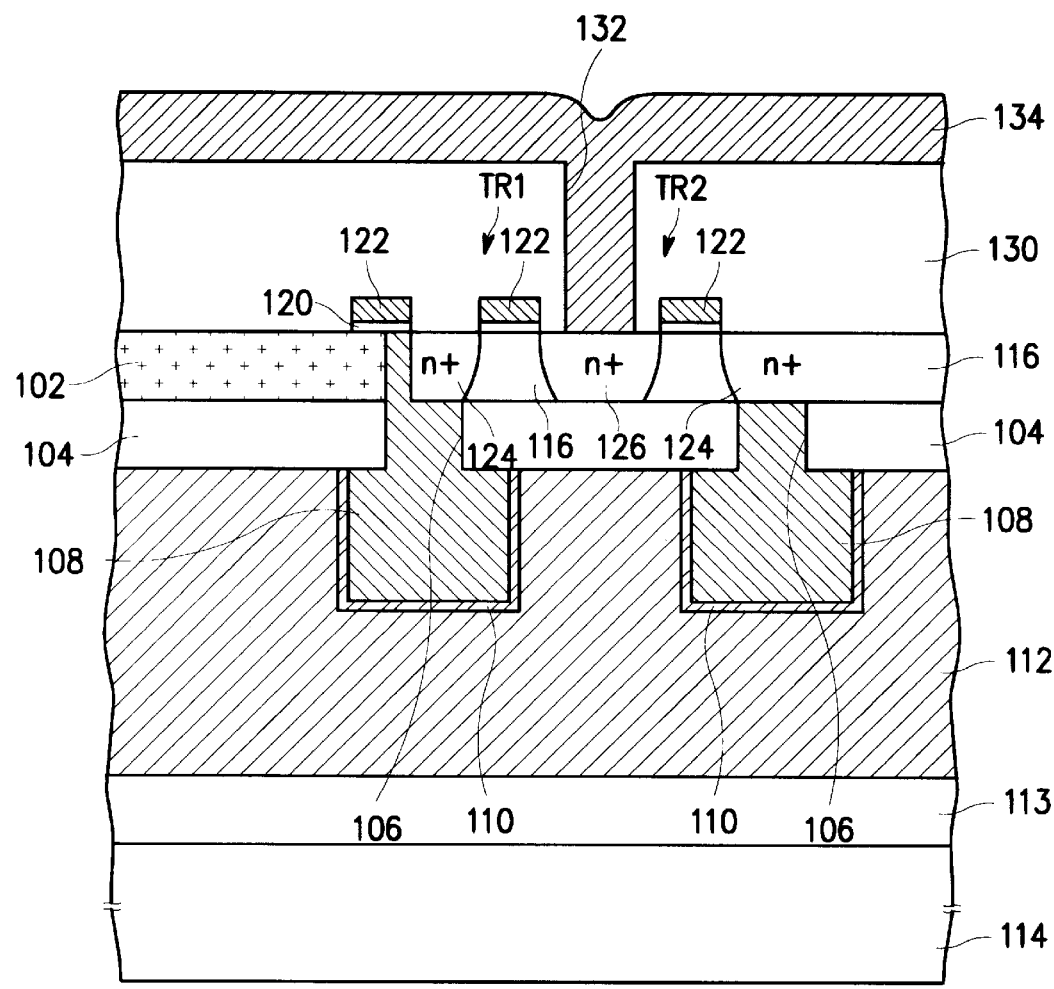
FIG. 20 is a cross-sectional view of the memory device of FIG. 19, taken along line 20-20'.
Figure 21:
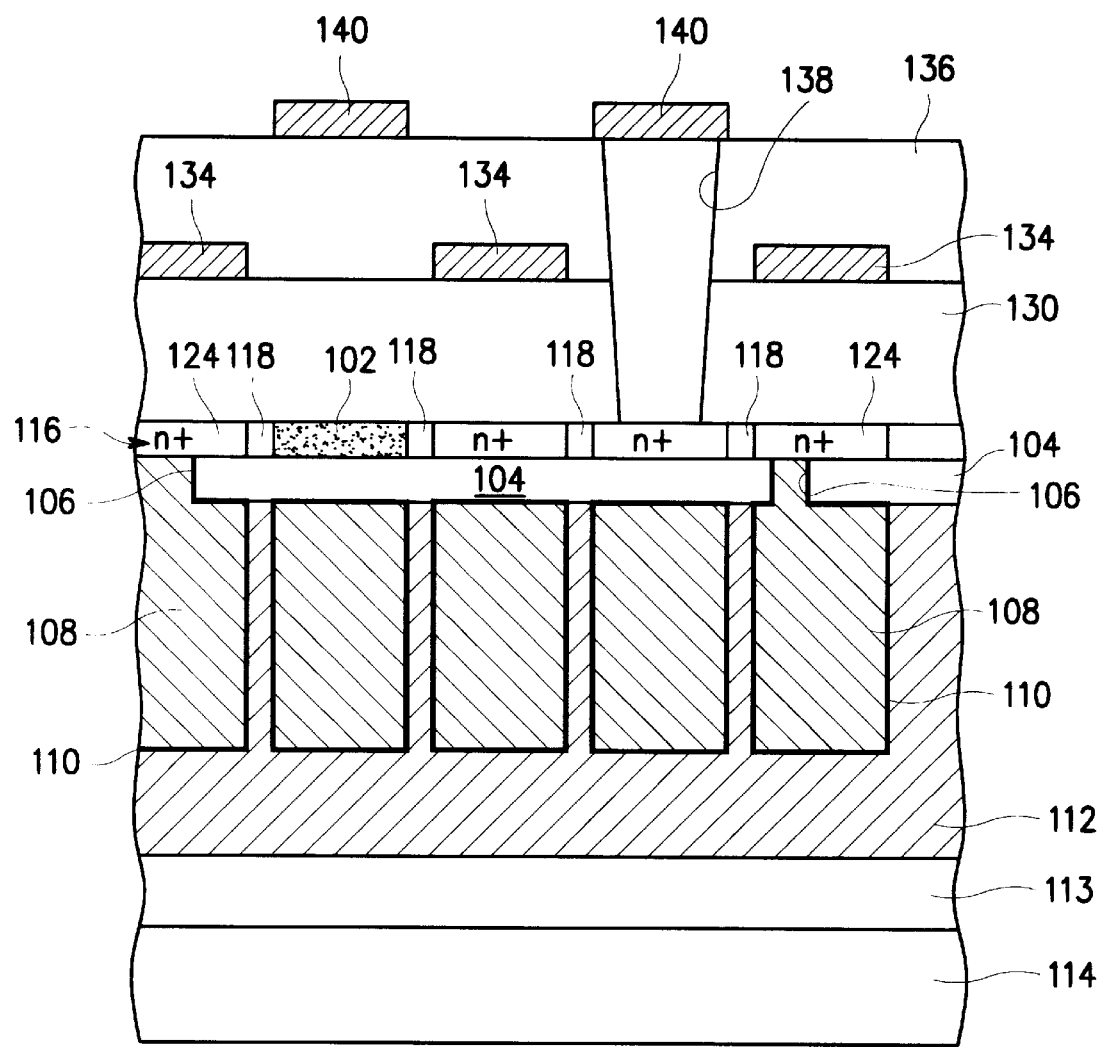
FIG. 21 is a cross-sectional view of the memory device of FIG. 19, taken along line 21-21'.

FIG. 19 is a layout diagram showing a DRAM device using an SOI structure according to another preferred embodiment of the present invention, and FIGS. 20 and 21 are cross sectional views, taken along lines 20-20' and 21-21' of FIG. 19, respectively. According to this preferred embodiment of the present invention, if the distance between the storage node contact 106 and the gate 122 is not sufficient due to the small design rule of the DRAM cell (even though the storage node contact 106 is formed to properly extend across the lower portions of the element isolation film 102 and semiconductor layer 116), the storage node contact 106 can be formed to extend from the lower portions of the semiconductor layer 116 and element isolation film 102 to the lower portion of the passing transistor formed on top of the element isolation film 102 as shown in FIG. 20, to secure sufficient distance between the storage node contact 106 and the gate 122.

In the event the storage node contact 106 is formed to extend to the lower portion of the passing transistor as described above, it becomes difficult to pattern the storage node 108 in parallel or perpendicular to the existing layers. To solve this problem and secure maximum capacitor area, the storage node 108 is diagonally arranged identical to the angle of the element isolation film 102, as shown in FIG. 19.

As described above, the present invention can reduce the area of a unit cell by applying a buried capacitor structure in which the capacitor is formed at the lower portion of the transistor by using a semiconductor substrate of SOI structure, and can secure sufficient distance between adjacent active regions for a pair of bit lines of folded bit line structure by forming double-layer bit lines at different heights from each other and skipping every other active region. Further, it is possible to achieve an active pitch corresponding to half of the photolithography pitch using the line type trench element isolation region extending along the bit line. Therefore, the area of the unit cell can be reduced to $4(1+\sigma)F^2$.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
    an SOI substrate having a semiconductor active layer therein;
    a first isolation region that extends into and partitions the semiconductor active layer into first and second active regions;
    first and second access transistors in the first and second active regions, respectively, said first and second access transistors having first and second gate electrodes, respectively;
    first and second word lines that extend parallel to each and diagonally across said first isolation layer and are electrically coupled to the first and second gate electrodes, respectively;
    a first electrically insulating layer on the SOI substrate;
    a first bit line electrically connected to a first source/drain region of said first access transistor by a first bit line contact which extends through said first electrically insulating layer and contacts the first source/drain region of said first access transistor;
    a second electrically insulating layer on said first bit line, opposite said first electrically insulating layer; and
    a second bit line electrically connected to a first source/drain region of said second access transistor by a second bit line contact which extends through said first and second electrically insulating layers and contacts the first source/drain region of said second access transistor.

2. The memory device of claim 1, wherein said SOI substrate comprises first and second storage capacitor electrodes that are buried therein and electrically connected to a second source/drain region of said first access transistor and a second source/drain region of said second access transistor, respectively.

3. The memory device of claim 2, wherein the first and second active regions are electrically isolated from each other.

4. The memory device of claim 3, wherein said first bit line comprises one bit line of a first folded bit line pair; and wherein said second bit line comprises one bit line of a second folded bit line pair.

5. A semiconductor memory device comprising:
  a semiconductor layer formed on top of a semiconductor substrate with interposition of a first insulating layer therebetween and provided as an active region;
  an element isolation film formed on top of said first insulating layer and diagonally arranged to isolate adjacent active regions to be crossed each other in a length direction;
  a transistor which is formed on said semiconductor layer and has a gate and source/drain regions;
  a capacitor having a first electrode which is formed at the lower portion of said transistor with interposition of a second insulating layer between said substrate and said first electrode and a second electrode which is formed to face said first electrode with interposition of a dielectric layer between said first electrode and said second electrode and is connected to the source region of said transistor via a storage node contact formed at said first insulating layer; and
  a first bit line formed on top of said semiconductor layer having said transistor formed thereon and connected to the drain region of corresponding transistor with skipping every other active region, and a second bit line connected to the drain region of the active region which is not connected to said first bit line at different heights from said first bit line.

6. The semiconductor memory device as claimed in claim 5, wherein said element isolation film isolates adjacent active regions to be crossed each other by a pitch of said gate in a length direction.

7. The semiconductor memory device as claimed in claim 5, wherein said semiconductor memory device has a folded bit line type sense amplifier structure where adjacent first bit lines and adjacent second bit lines are sensed as a pair of bit lines, respectively.

8. The semiconductor memory device as claimed in claim 5, further comprising:
  a third insulating layer which is formed between said first bit line and said semiconductor layer having said transistor and has a first bit line contact for exposing the drain region of corresponding transistor with skipping every other active region; and
  a fourth insulating layer which is formed between said first and second bit lines and has a second bit line contact for exposing the drain region of the active region where said first bit line contact is not formed.

9. The semiconductor memory device as claimed in claim 5, wherein said storage node contact is formed to extend across said element isolation film and the active region.

10. The semiconductor memory device as claimed in claim 5, further comprising a line type trench element isolation region formed on top of said semiconductor layer to isolate adjacent active regions and extended along said bit lines.

11. A semiconductor memory device comprising:
  a semiconductor layer formed on top of a semiconductor substrate with interposition of a first insulating layer therebetween and provided as an active region;
  an element isolation film formed on top of said first insulating layer and diagonally arranged to isolate adjacent active regions to be crossed each other in a length direction;
  a transistor which is formed on said semiconductor layer and has a gate and source/drain regions;
  a capacitor having a first electrode which is formed at the lower portion of said transistor with interposition of a second insulating layer between said substrate and said first electrode and a second electrode which is formed to face said first electrode with interposition of a dielectric layer between said first electrode and said second electrode and is connected to the source region of said transistor via a storage node contact formed at said first insulating layer, the electrode connected to the source region of said transistor being diagonally arranged in the same direction as said element isolation film; and
  a first bit line formed on top of said semiconductor layer having said transistor formed thereon and connected to the drain region of corresponding transistor with skipping every other active region, and a second bit line connected to the drain region of the active region which is not connected to said first bit line at different heights from said first bit line.

12. The semiconductor memory device as claimed in claim 11, wherein said storage node contact is formed to extend from the lower portions of said element isolation film and active region to the lower portion of the transistor formed on top of said element isolation film.

* * * * *